United States Patent
Yasukouchi et al.

(10) Patent No.: US 6,903,609 B2
(45) Date of Patent: Jun. 7, 2005

(54) OPERATIONAL AMPLIFIER

(75) Inventors: Katsuyuki Yasukouchi, Kasugai (JP); Ayuko Watabe, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/108,341

(22) Filed: Mar. 29, 2002

(65) Prior Publication Data

US 2003/0042982 A1 Mar. 6, 2003

(30) Foreign Application Priority Data

Aug. 29, 2001 (JP) .......................... 2001-259605

(51) Int. Cl.[7] .............................................. H03F 3/26
(52) U.S. Cl. .................................. 330/267; 330/255
(58) Field of Search ............................ 330/255, 261, 330/267, 273

(56) References Cited

U.S. PATENT DOCUMENTS

| | | | |
|---|---|---|---|
| 4,431,972 A | * | 2/1984 | Ishii et al. ................. 330/267 |
| 5,467,058 A | * | 11/1995 | Fujita ......................... 330/267 |
| 5,689,211 A | * | 11/1997 | Embree ....................... 330/266 |

* cited by examiner

*Primary Examiner*—Henry Choe
(74) *Attorney, Agent, or Firm*—Staas & Halsey LLP

(57) ABSTRACT

An operational amplifier that decreases idling current, widens a voltage output range, and increases load driving capacity. The operational amplifier includes a first output transistor connected to a high potential power supply. A second output transistor is connected between the first output transistor and a low potential power supply. The first and second output transistors generate an output signal at a node between the first output transistor and the second output transistor. An idling current control circuit controls the collector current of the first output transistor in accordance with the base voltage of the second output transistor to control the idling current of the first and second output transistors.

3 Claims, 6 Drawing Sheets

OPERATIONAL AMPLIFIER

BACKGROUND OF THE INVENTION

The present invention relates to an operational amplifier, and more particularly, to an operational amplifier having an output circuit that uses a bipolar transistor.

There is a demand for decreasing the power supply voltage and power consumption of semiconductor devices used in electronic equipment. Accordingly, it is required that such semiconductor device employ an operational amplifier (op amp) that efficiently amplifies signals.

FIG. 1 is a schematic circuit diagram of a prior art op amp 100. A first input signal IN1 is provided to the base of a PNP transistor Tr1, and a second input signal IN2 is provided to the base of a PNP transistor Tr2. The collectors of the transistors Tr1, Tr2 are connected to the collectors of NPN transistors Tr3, Tr4, respectively. The NPN transistors Tr3, Tr4 configure a current mirror circuit.

When the voltage of the second input voltage IN2 is greater than that of the first input signal IN1, the collector current of the transistor Tr2 decreases. This decreases the base current and the collector current of an NPN transistor Tr5.

When the voltage of the second input voltage IN2 is less than that of the first input signal IN1, the collector current of the transistor Tr2 increases. This increases the base current and the collector current of the transistor Tr5.

When the collector current of the transistor Tr5 decreases, the base current and collector current of a first output transistor Tr6, which is an NPN transistor, increases. Further, the base current and collector current of a PNP transistor Tr7 decreases.

When the collector current of the transistor Tr5 increases, the base current and collector current of the first output transistor Tr6 decreases. Further, the base current and collector current of the PNP transistor Tr7 increases.

When the collector current of the transistor Tr7 increases, the base current and collector current of a second output transistor Tr8, which is an NPN transistor, increases. Further, when the collector current of the transistor Tr7 decreases, the base current and collector current of the second output transistor Tr8 decreases. Since the first and second output transistors Tr6, Tr8 are both NPN transistors, a quasi-complementary circuit configures an output circuit of the op amp 100.

The collector current of the transistor Tr7 is the collector current of an NPN transistor Tr9. An idling current setting circuit, which includes transistors Tr10–Tr12 and a resistor R, controls the base current of the transistor Tr9.

The idling current setting circuit receives the output voltage Vo. When the output voltage Vo increases, the idling current setting circuit functions to increase the base current and collector current of the transistor Tr9. When the output voltage Vo decreases, the idling current setting circuit functions to decrease the base current and the collector current of the transistor tr9.

The base voltage of the transistor Tr9 is the sum of the output voltage Vo and the base-emitter voltages VBE6, VBE7, VB9 of the transistors Tr6, Tr7, Tr9. The base voltage of the transistor Tr9 is also the sum of the output voltage Vo and the base-emitter voltages VBE10, VBE11, VBE12 of the transistors Tr10–Tr12. Accordingly, the base-emitter voltage VBE10 of the transistor Tr10 is substantially the same as the base-emitter voltage VBE6 of the transistor Tr6.

When the input signals IN1, IN2 increase the collector current of the transistor Tr5, the collector current of the first output transistor Tr6 decreases, the collector current of the second output transistor Tr8 increase, and the output voltage Vo decreases.

When the input signals IN1, IN2 decrease the collector current of the transistor Tr5, the collector current of the first output transistor Tr6 increases, the collector current of the second output transistor Tr8 decrease, and the output voltage Vo increases.

The base-emitter voltage VBE10 of the transistor Tr10 sets the idling current (bias current) Id, which flows through the output transistor Tr6. The collector current of the transistor TR10 sets the idling current of the transistor Tr8.

When allowable supply currents I1, I2 of current sources 1$a$, 1$b$ are the same, the idling current Id that flows from the power supply Vcc to the ground GND via the output transistors Tr6, Tr8 is represented by the following equation. In the equation, Q6, Q7, Q9, Q10, Q11, and Q12 respectively represent the size of the transistors Tr6, Tr7, Tr9, Tr10, Tr11, and Tr12.

$$Id = I2 \times Q9/Q12 \times Q7/Q11 \times Q6/Q10$$

The second output transistor Tr8 is an NPN transistor. Thus, the minimum output voltage VoL may be decreased to substantially the level of the ground GND. However, the voltage difference between the output voltage Vo and the power supply voltage (Vcc) must be greater than the sum of the base-emitter voltages VBE10, VBE11, VBE12 to have the idling current setting circuit function normally. Thus, the maximum output voltage VoH cannot be increased to the power supply voltage.

The idling current Id must be decreased to decrease power consumption. To decrease the idling current Id, the supply current I2 of the current source 1$b$ may be decreased. However, a decrease in the supply current I2 would decrease the maximum output current of the second output transistor Tr8 and reduce load driving capacity.

To increase the load driving capacity by increasing the output current of the first output transistor Tr6, the first output transistor Tr6 may be Darlington-connected. However, a diode-connected transistor must be arranged between the bases of the first output transistor Tr6 and the transistor Tr7 to equalize the base-emitter voltage of a Darlington-connected first output transistor with the base-emitter voltage VBE10. In such case, the supply current I1 of the current source 1$a$ would affect the value of the base-emitter voltage of the first output transistor Tr6. Further, differences between Darlington-connected first output transistors would increase fluctuations of the idling current Id.

When a complementary circuit is employed as the output circuit (i.e., the second output transistor Tr8 being a PNP transistor), a base-emitter voltage VBE of the first output transistor (NPN transistor) Tr6 would exist between the power supply Vcc and the maximum output voltage VoH. Further, a base-emitter voltage VBE of the second output transistor (PNP transistor) Tr8 would exist between the minimum output voltage VoL and the ground GND. Accordingly, the range of the output voltage Vo may not be sufficient.

SUMMARY OF THE INVENTION

It is an object of the present invention to provide an operational amplifier that decreases the idling current, widens the voltage output range, and increases the load driving capacity.

To achieve the above object, the present invention provides an operational amplifier including a first output transistor connected to a high potential power supply and having a control terminal. A second output transistor is connected between the first output transistor and a low potential power supply and has a control terminal. The first and second output transistors generate an output signal at a node between the first output transistor and the second output transistor. An idling current control circuit is connected to the first and second output transistors for controlling current that flows through the first output transistor in accordance with a voltage of the control terminal of the second output transistor to control an idling current of the first and second output transistors.

A further perspective of the present invention is an operational amplifier including a first output transistor connected to a high potential power supply. A second output transistor is connected between the first output transistor and a low potential power supply. The first and second output transistors generate an output signal at a node between the first output transistor and the second output transistor. An idling current control circuit is connected to the first and second output transistors to control a collector current of the first output transistor in accordance with a base voltage of the second output transistor to control an idling current of the first and second output transistors.

A further perspective of the present invention is an operational amplifier including an input circuit. A first NPN transistor is connected to the input circuit. A first current source is connected between an emitter of the first NPN transistor and a low potential power supply. An idling current control circuit is connected to the emitter of the first NPN transistor and the first current source. The idling current control circuit includes a second current source and a third current source connected to a high potential power supply. A second NPN transistor has a collector connected to the second current source and a base of the second NPN transistor. A third NPN transistor has a collector connected to the third current source, a base connected to the base of the second NPN transistor, and an emitter connected to the emitter of the first NPN transistor. A fourth NPN transistor is connected between an emitter of the second NPN transistor and the low potential power supply. The fourth NPN transistor has a collector connected to a base of the fourth NPN transistor. A PNP transistor has a base connected to the collector of the third NPN transistor and an emitter connected to the high potential power supply. A fifth NPN transistor has a base connected to the emitters of the first and third NPN transistors, a collector connected to the emitter of the PNP transistor, and an emitter connected to the low potential power source.

A further perspective of the present invention is an operational amplifier connecting a source side output transistor and a sink side output transistor in series between a high potential power supply and a low potential power supply to output an output signal from a node between the output transistors. The operational amplifier includes an idling current control circuit to control an idling current of the output transistors by controlling a collector current of the source side output transistor based on a base potential at the sink side output transistor.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
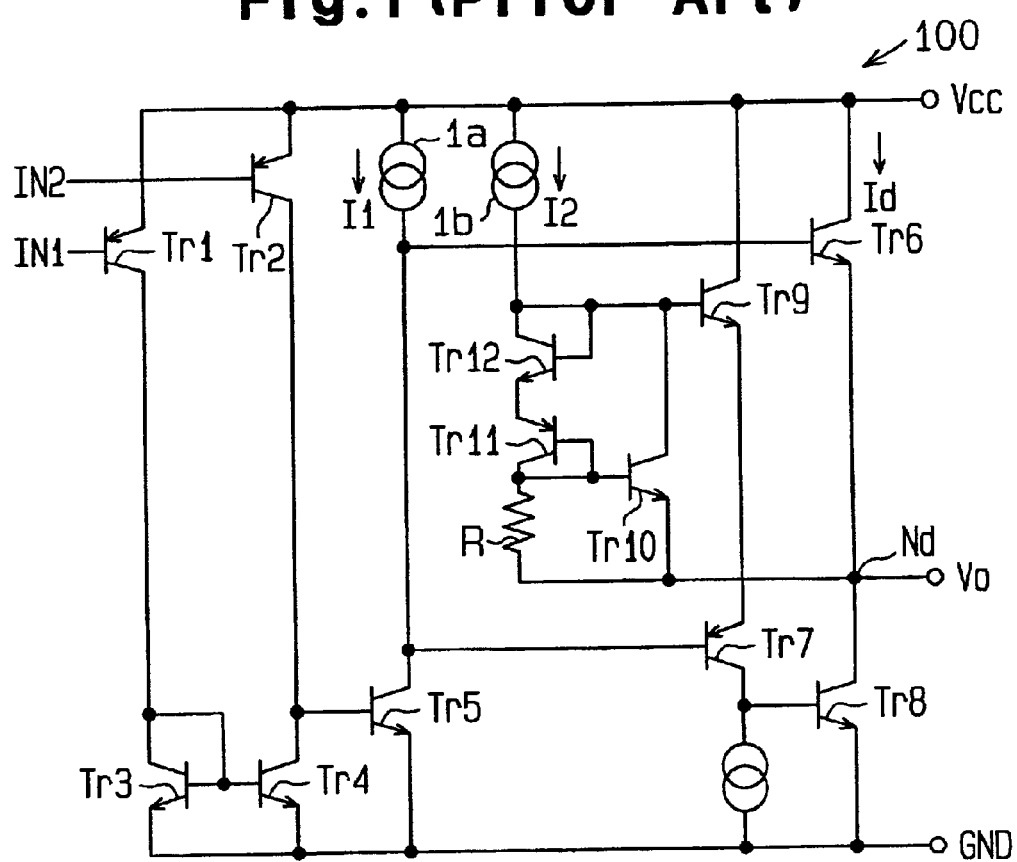
FIG. 1 is a schematic circuit diagram of a prior art operational amplifier.

In the drawings, like numerals are used for like elements throughout.

Figure 2:
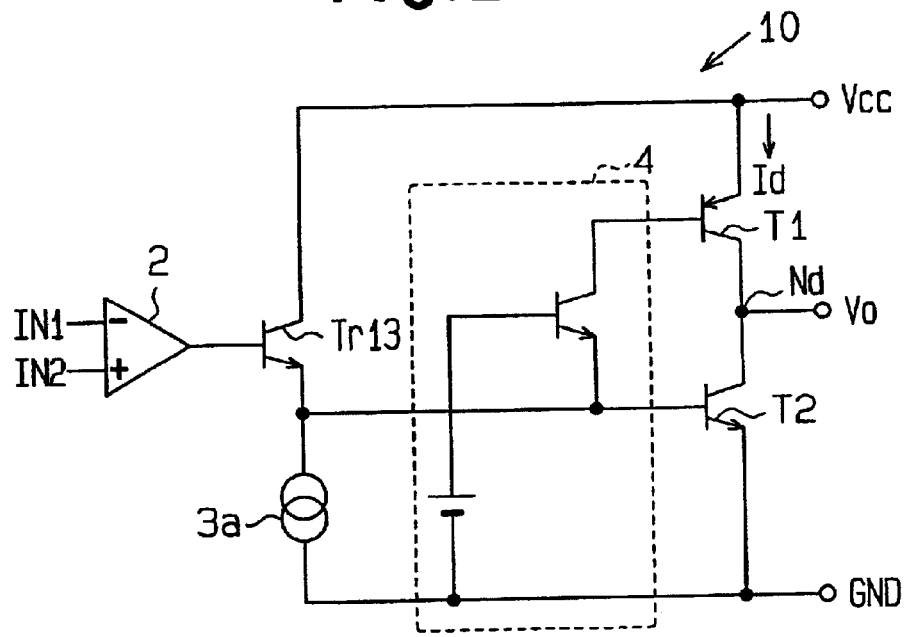
FIG. 2 is a schematic circuit diagram of an operational amplifier according to a first embodiment of the present invention.

FIG. 2 is a schematic circuit diagram of an operational amplifier (op amp) 10 according to a first embodiment of the present invention. The op amp 10 includes an input circuit 2, an idling current control circuit 4, and an output circuit. The output circuit includes a first output transistor t1 and a second output transistor T2.

The first and second output transistors T1, T2 are connected in series between a high potential power supply Vcc and a low potential power supply GND. The first output transistor T1 is connected to the high potential power supply Vcc, and the second output transistor T2 is connected to the low potential power supply GND. An output voltage Vo is output from a node Nd between the first and second transistors T1, T2.

The idling current control circuit 4 controls the collector current of the first output transistor T1 in accordance with the base voltage of the second output transistor T2. This controls the idling current (bias current) Id of the output transistors T1, T2.

The op amp 10 sets the idling current Id and the maximum output current of the output transistor separately. Accordingly, the maximum output current is obtained even though the idling current Id is decreased to reduce power consumption.

Figure 3:
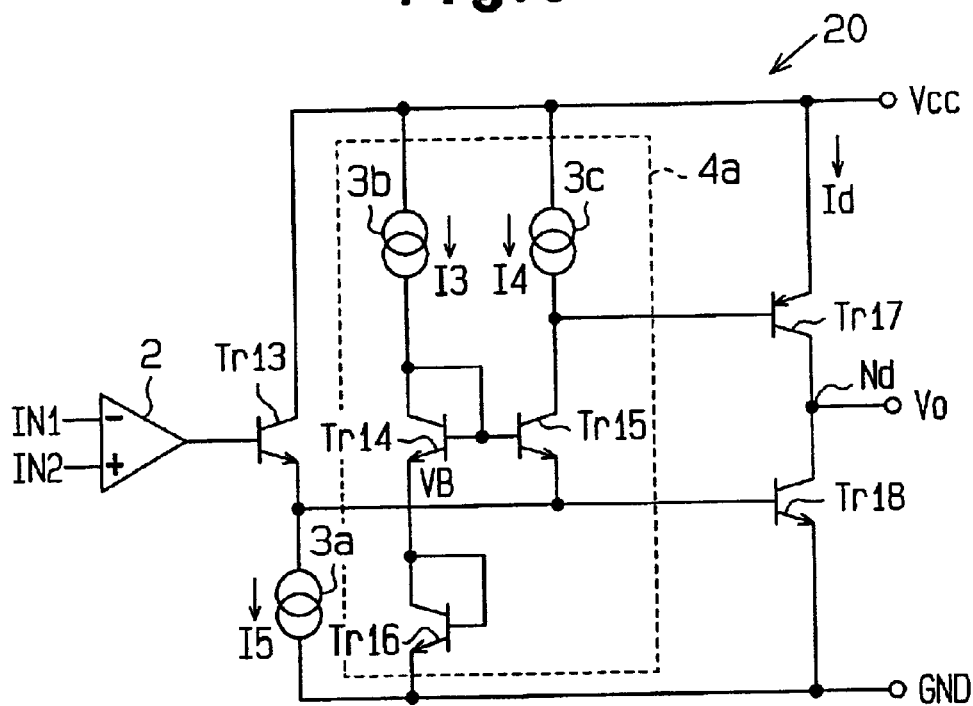
FIG. 3 is a schematic circuit diagram of an operational amplifier according to a second embodiment of the present invention.

FIG. 3 is a schematic circuit diagram of an op amp 20 according to a second embodiment of the present invention. The op amp 20 includes an input circuit 2, an idling current control circuit 4a, and an output circuit. The idling current control circuit 4a includes two current sources 3b, 3c and three NPN transistors Tr14, Tr15, Tr16.

The output circuit includes a first (source side) output transistor Tr17 and a second (sink side) output transistor Tr18. The first output transistor Tr17 is a PNP transistor, and the second transistor Tr18 is an NPN transistor.

The input circuit 2 receives input signals IN1, IN2. The configuration of the input circuit 2 is the same as that of the prior art input circuit, which includes the transistors Tr1–Tr4. The output signal of the input circuit 2 is provided to the base of an NPN transistor Tr13.

The collector of the transistor Tr13 is connected to the power supply Vcc, and the emitter of the transistor Tr13 is connected to the ground GND via a current source 3a. The bases of the NPN transistors Tr14, Tr15 are connected to each other and to the collector of the transistor Tr14. The NPN transistors Tr14, Tr15 configure a current mirror circuit.

The collector of the transistor Tr14 is connected to the power supply Vcc via a current source 3b, and the emitter of the transistor Tr14 is connected to the ground GND via the NPN transistor Tr16, which is diode-connected. The collector of the transistor tr15 is connected to the power supply Vcc via a current source 3c and to the base of the first output transistor Tr17.

The emitter of the first output transistor Tr17 is connected to the power supply Vcc, and the collector of the first output transistor Tr17 is connected to the collector of the second output transistor Tr18. The emitter of the second output transistor Tr18 is connected to the ground GND, and the base of the second output transistor Tr18 is connected to the emitters of the transistor Tr15, Tr13. The output voltage Vo is output from a node Nd between the first and second output transistors Tr17, Tr18.

In the op amp 20, the emitter voltage VB of the transistor Tr14, which is a constant voltage, is the base-emitter voltage VBE16 of the transistor Tr16. The emitter voltage VB is determined by a constant current I3, which is supplied from the current source 3b.

When the input signals IN1, IN2 increase the collector current of the transistor Tr13, the collector current of the second output transistor Tr18 increases. The increase in the collector current of the transistor Tr13 increases the emitter voltage of the transistor Tr15. This decreases the collector current of the transistor Tr15 and the base current of the first output transistor Tr17. Thus, the collector current of the first output transistor Tr17 decreases and the output voltage Vo decreases.

When the input signals IN1, IN2 decrease the collector current of the transistor Tr13, the collector current of the second output transistor Tr18 decreases. The decrease in the collector current of the transistor Tr13 decreases the emitter voltage of the transistor Tr15. This increases the collector current of the transistor Tr15 and the base current of the first output transistor Tr17. Thus, the collector current of the first output transistor Tr17 increases and the output voltage Vo increases.

When the collector current of the second output transistor Tr18 increases in accordance with a comparison (differential voltage) between the constant voltage VB and the emitter voltage of the transistor Tr15, the collector current of the first output transistor Tr17 is decreased. When the collector current of the second output transistor Tr18 decreases, the collector current of the first output transistor Tr17 increases.

Accordingly, the constant voltage VB (constant current I3) stabilizes the idling current Id that flows from the power supply Vcc to the ground GND via the output transistors Tr17, Tr18.

The relationship between the idling current Id and the constant current I3 is represented by the equation shown below. In the equation, I4 represents the current supplied by the current source 3c, and Q18, Q16, Q15, Q14 respectively represent the size of the transistors Tr18, Tr16, Tr15, Tr14.

$$Id = I3 \times I3/I4 \times Q18/Q16 \times Q15/Q14$$

As apparent from the equation, a constant current I5 flowing through the current source 3a is the maximum base current of the first output transistor Tr17 although the constant current I5 does not affect the idling current Id. Accordingly, the constant current I5 is set to guarantee that the maximum output current of the first output transistor Tr17 would be obtained.

The op amp of the second embodiment has the advantages discussed below.

(1) The idling current Id and the maximum output current of the output transistor may be set separately. Accordingly, the maximum output current is obtained even when the idling current Id is decreased to reduce power consumption.

(2) The output circuit is a complementary circuit including a PNP transistor and an NPN transistor. Thus, the maximum value of the output voltage Vo may be increased to the level of the power supply voltage Vcc, and the minimum value of the output voltage Vo may be decreased to the level of the ground GND.

(3) A predetermined potential difference between the power supply Vcc and the output voltage Vo is not required to set the idling current Id. Accordingly, the maximum value of the output voltage Vo may be increased to the level of the power supply voltage Vcc.

Figure 4A:
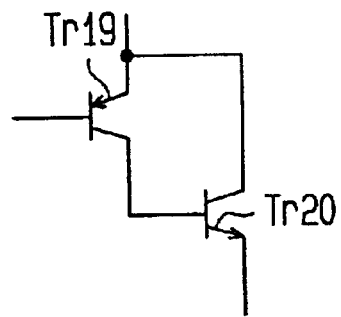
FIGS. 4A and 4B are circuit diagrams showing other examples of an output transistor employed in the operational amplifier of FIG. 3.

(4) Referring to FIG. 4A, the first output transistor Tr17 may be replaced by a PNP transistor Tr19 and an NPN transistor Tr20, which are inverted-Darlington-connected to each other. Alternatively, referring to FIG. 4B, the first output transistor Tr17 may be replaced by two PNP transistors Tr21, Tr22, which are Darlington-connected to each other. In such case, the idling current Id is not varied. Accordingly, the maximum output current may be decreased while increasing the idling current Id.

Figure 5:
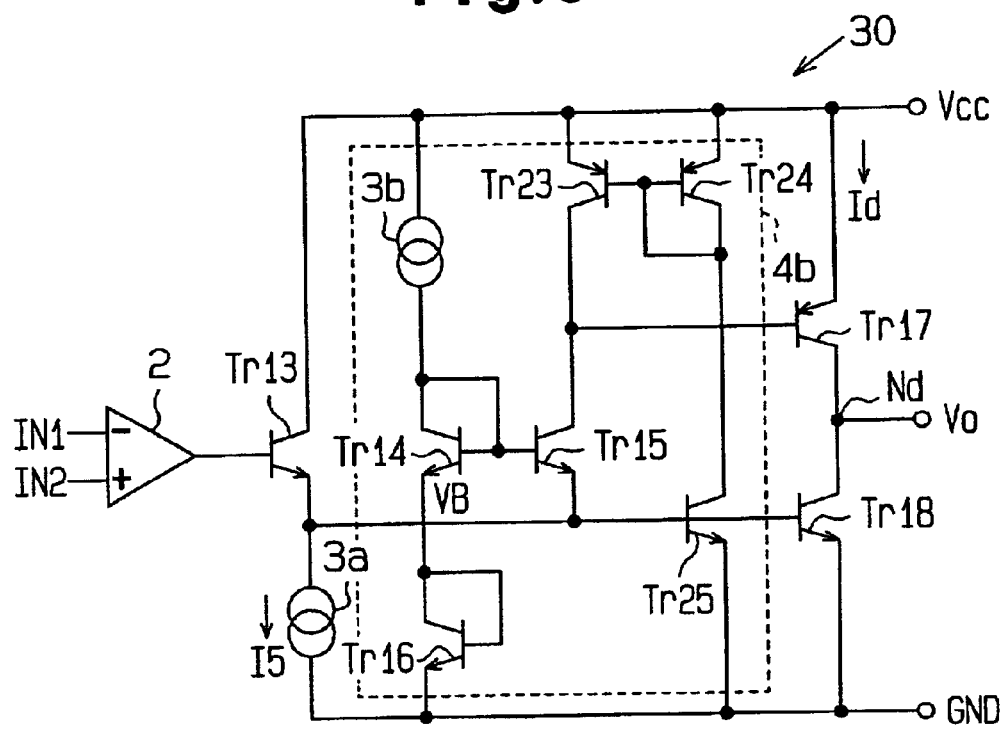
FIG. 5 is a schematic circuit diagram of an operational amplifier according to a third embodiment of the present invention.

FIG. 5 is a schematic circuit diagram of an op amp 30 according to a third embodiment of the present invention. The op amp 30 of the third embodiment differs from the op amp 20 of the second embodiment only in the idling current control circuit. The current source 3c of the idling current control circuit 4a is replaced by PNP transistors Tr23, Tr24 and an NPN transistor Tr25 in an idling current control circuit 4b.

The base of the transistor Tr25 is connected to the emitter of the transistor Tr13 and the base of the second output transistor Tr18. The emitter of the transistor Tr25 is connected to the ground GND.

The transistors Tr23, Tr24 configure a current mirror circuit. The bases of the transistors Tr23, Tr24 are connected to the collector of the transistor Tr24. The collector of the transistor Tr23 is connected to the collector of the transistor Tr15 and the base of the first output transistor Tr17. The collector of the transistor Tr24 is connected to the collector of the transistor Tr25.

When the emitter voltage of the transistor Tr15 increases and the collector current of the transistor Tr15 decreases, the collector current of the transistor Tr25 increases. This increases the collector currents of the transistors Tr23, Tr24 and increases the base current of the first output transistor Tr17.

When the emitter voltage of the transistor Tr15 decreases and the collector current of the transistor Tr15 increases, the collector current of the transistor Tr25 decreases. This decreases the collector currents of the transistors Tr23, Tr24 and decreases the base current of the first output transistor Tr17.

Accordingly, the op amp 30 of the third embodiment has the same advantages as the op amp 20 of the second embodiment. In addition, the transistors Tr15 and Tr25 are configured to perform differential operations. Thus, in comparison with the second embodiment, the first output transistor Tr17 operates at a higher speed.

Figure 4B:
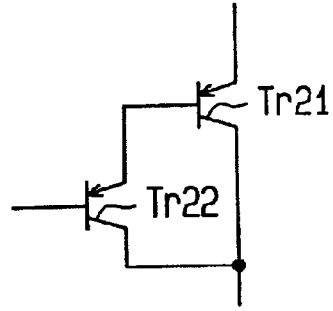

In the third embodiment, the first output transistor Tr17 may also be replaced by the circuits of FIGS. 4A and 4B.

Figure 6:
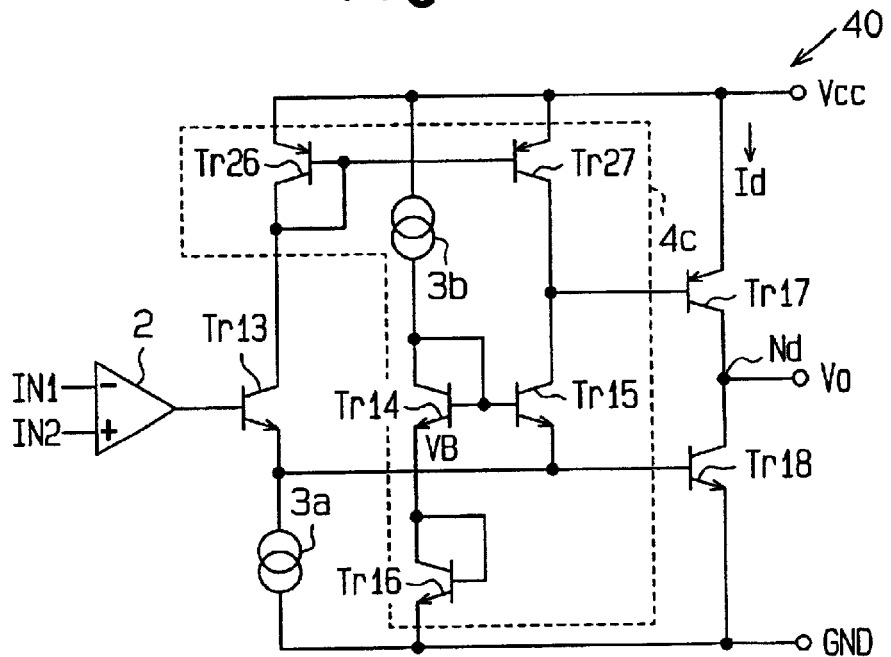
FIG. 6 is a schematic circuit diagram of an operational amplifier according to a fourth embodiment of the present invention.

FIG. 6 is a schematic circuit diagram of an op amp 40 according to a fourth embodiment of the present invention. The op amp 40 of the fourth embodiment differs from the op amp 20 of the second embodiment only in the idling current control circuit. The current source 3c of the idling current control circuit 4a is replaced by PNP transistors Tr26, Tr27 in an idling current control circuit 4c.

The transistors Tr26, Tr27 configure a current mirror circuit. The bases of the transistors Tr26, Tr27 are connected to the collector of the transistor Tr26. The collector of the transistor Tr26 is connected to the collector of the transistor Tr13. The collector of the transistor Tr27 is connected to the base of the first output transistor Tr17 and the collector of the transistor Tr15.

When the collector current of the transistor Tr13 increases and the emitter voltage of the transistor Tr15 increases, the collector current of the transistor Tr15 decreases. This increases the collector currents of the transistors Tr26, Tr27 and increases the base current of the first output transistor Tr17.

When the collector current of the transistor Tr13 decreases and the emitter voltage of the transistor Tr15 decreases, the collector current of the transistor Tr15 increases. This decreases the collector currents of the transistors Tr26, Tr27 and decreases the base current of the first output transistor Tr17.

Accordingly, the op amp 40 of the fourth embodiment has the same advantages as the op amp 30 of the third embodiment.

Figure 7:
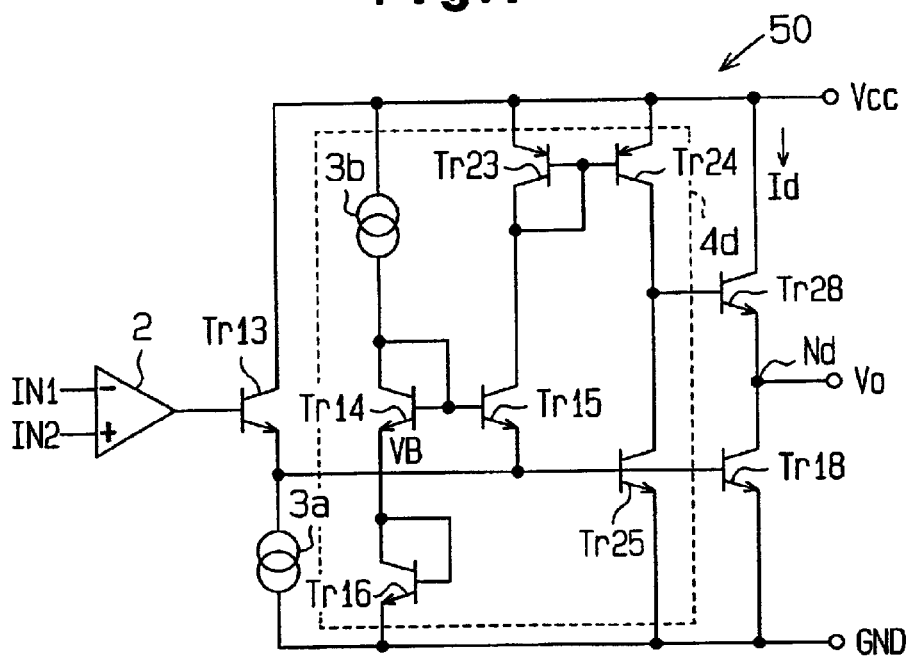
FIG. 7 is a schematic circuit diagram of an operational amplifier according to a fifth embodiment of the present invention.

FIG. 7 is a schematic circuit diagram of an op amp 50 according to a fifth embodiment of the present invention. The op amp 50 of the fifth embodiment differs from the op amp 30 of the third embodiment only in that the first output transistor Tr17 of the op amp 30 is replaced by an output transistor Tr28, which is an NPN transistor. The bases of the transistors Tr23, Tr24 in an idling current control circuit 4d are connected to the collector of the transistor Tr23. The base of the first output transistor Tr28 is connected to the collector of the transistor Tr24.

When the emitter voltage of the transistor Tr15 increases and the collector current of the transistor Tr15 decreases, the collector current of the transistor Tr25 increases. This decreases the collector currents of the transistors Tr23, Tr24 and decreases the base current of the first output transistor Tr28.

When the emitter voltage of the transistor Tr15 decreases and the collector current of the transistor Tr15 increases, the collector current of the transistor Tr25 decreases. This increases the collector currents of the transistors Tr23, Tr24 and increases the base current of the first output transistor Tr28.

The op amp 50 of the fifth embodiment has the advantages described below.

(1) The idling current Id and the maximum output current of the output transistor may be set separately. Accordingly, the maximum output current is obtained even when the idling current Id is decreased to reduce power consumption.

(2) The maximum value of the output voltage Vo may be increased to a level decreased from the power supply Vcc by an amount corresponding to the decreased base-emitter voltage VBE28 of the first output transistor Tr28.

Figure 8A:
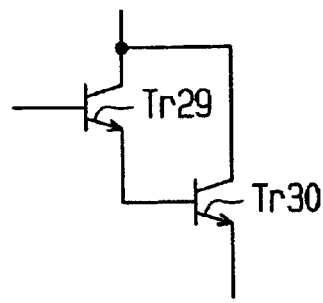
FIGS. 8A and 8B are circuit diagrams showing other examples of an output transistor employed in the operational amplifier of FIG. 5.
Figure 8B:
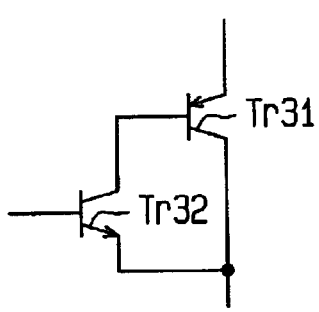

(3) Referring to FIG. 8A, the first output transistor Tr28 may be replaced by two NPN transistors Tr29, Tr30, which are Darlington-connected to each other. Alternatively, referring to FIG. 8B, the first output transistor Tr28 may be replaced by a PNP transistor Tr31 and an NPN transistor Tr32, which are inverted-Darlington-connected to each other. In such case, the idling current Id is not varied. Accordingly, the idling current Id may be decreased while increasing the maximum output current.

(4) The first output transistor may easily be replaced by an NPN transistor.

Figure 9:
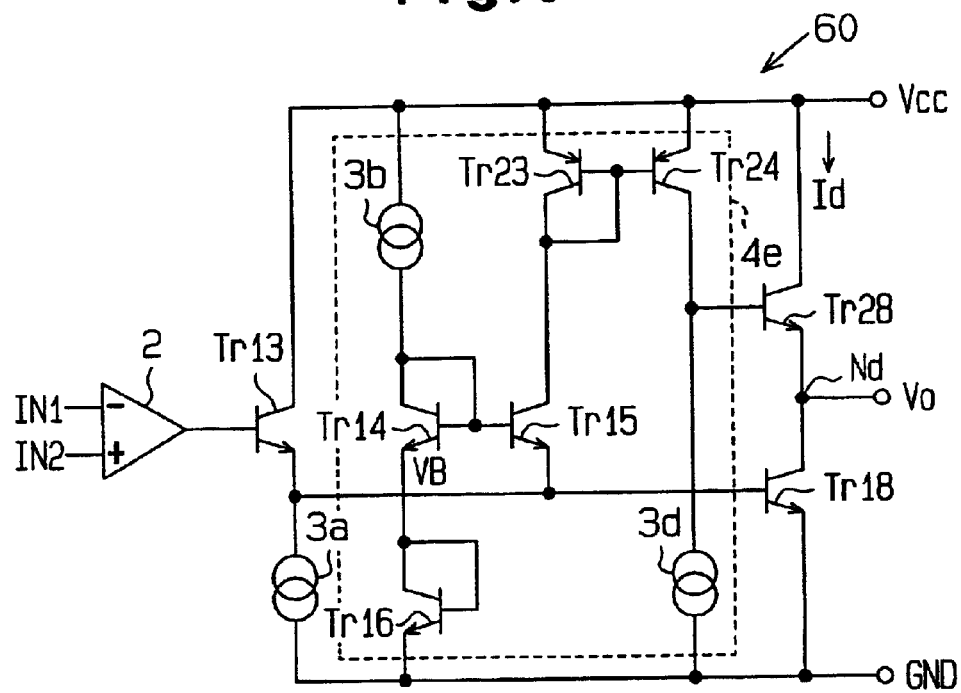
FIG. 9 is a schematic circuit diagram of an operational amplifier according to a sixth embodiment of the present invention.

FIG. 9 is a schematic circuit diagram of an op amp 60 according to a sixth embodiment of the present invention. The op amp 60 of the sixth embodiment differs from the op amp 50 of the fifth embodiment only in the idling current control circuit. The transistor Tr25 of the idling current control circuit 4d is replaced by a current source 3d in an idling current control circuit 4e.

The op amp 60 of the sixth embodiment has the same advantages as the op amp 50 of the fifth embodiment. In comparison to the fifth embodiment, the first output transistor Tr28 is operated at a slightly lower speed.

Figure 10:
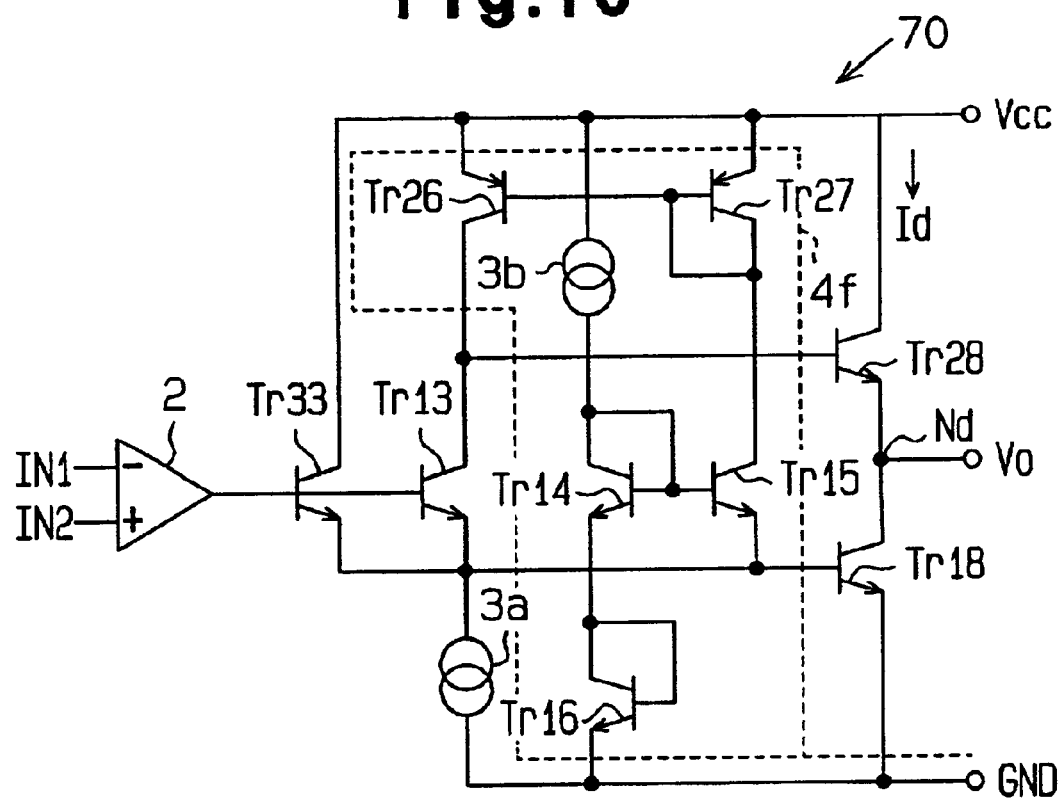
FIG. 10 is a schematic circuit diagram of an operational amplifier according to a seventh embodiment of the present invention.

FIG. 10 is a schematic circuit diagram of an op amp 70 according to a seventh embodiment of the present invention. The op amp 70 of the seventh embodiment differs from the op amp 40 of the fourth embodiment only in that the first output transistor Tr17 of the op amp 40 is replaced by an output transistor Tr28, which is an NPN transistor.

The bases of the transistors Tr26, Tr27 in an idling current control circuit 4f are connected to the collector of the transistor Tr27. The base of the first output transistor Tr28 is connected to the collector of the transistor Tr26. Further, a transistor Tr33 is added to guarantee that the base current of the second output transistor would be obtained.

It should be apparent to those skilled in the art that the present invention may be embodied in many other specific forms without departing from the spirit or scope of the invention. Particularly, it should be understood that the present invention may be embodied in the following forms.

The constant current source 3a may be replaced by a circuit that includes a resistor or a circuit that includes a resistor and a constant current source.

The output transistors Tr17, Tr18, and Tr28 may be field-effect transistors (FETs).

The present examples and embodiments are to be considered as illustrative and not restrictive, and the invention is not to be limited to the details given herein, but may be modified within the scope and equivalence of the appended claims.

What is claimed is:

1. An operational amplifier comprising:
   a first output transistor connected to a high potential power supply and having a control terminal;
   a second output transistor connected between the first output transistor and a low potential power supply and having a control terminal, wherein the first and second output transistors generate an output signal at a node between the first output transistor and the second output transistor; and
   an idling current control circuit connected to the first and second output transistors controlling a current that flows through the first output transistor, among the first and second output transistors, in accordance with a voltage of the control terminal of the second output transistor to control an idling current of the first and second output transistors, wherein the idling current control circuit includes a transistor having a collector, which receives a control current provided to control the control terminal of the first output transistors, and an emitter connected to the control terminal of the second output transistor.

2. An operational amplifier comprising:

a first output transistor connected to a high potential power supply;

a second output transistor connected between the first output transistor and a low potential power supply, wherein the first and second output transistors generate an output signal at a node between the first output transistor and the second output transistor; and an idling current control circuit connected to the first and second output transistors controlling a collector current of the first output transistor, among the first and second output transistors, in accordance with a base voltage of the second output transistor to control an idling current of the first and second output transistors, wherein the idling current control circuit includes a transistor having a collector, which receives a base current provided to a base of the first output transistor, and an emitter connected to a base of the second output transistor.

3. An operational amplifier connecting a source side output transistor and a sink side output transistor in series between a high potential power supply and a low potential power supply to output an output signal from a node between the output transistors, the operational amplifier comprising:

an idling current control circuit controlling an idling current of the output transistors by controlling a collector current of the source side output transistor, among the source and sink side output transistors, based on a base potential at the sink side output transistor, wherein the idling current control circuit includes a transistor having a collector, which receives a base current provided to a base of the source side output transistors, and an emitter connected to a base of the sink side output transistor.

* * * * *

UNITED STATES PATENT AND TRADEMARK OFFICE
CERTIFICATE OF CORRECTION

PATENT NO. : 6,903,609 B2
DATED : June 7, 2005
INVENTOR(S) : Katsuyuki Yasukouchi et al.

It is certified that error appears in the above-identified patent and that said Letters Patent is hereby corrected as shown below:

Column 9,
Line 8, replace "transistors" with -- transistor --.

Column 10,
Line 21, replace "transistors" with -- transistor --.

Signed and Sealed this

Twenty-first Day of February, 2006

JON W. DUDAS
*Director of the United States Patent and Trademark Office*